United States Patent [19]

Riney et al.

[11] 4,272,690

[45] Jun. 9, 1981

[54] CLOCK CONTROLLED PULSE WIDTH MODULATOR

[75] Inventors: John S. Riney, Potomac, Md.; Thomas F. Chamblin, Purcellville, Va.

[73] Assignee: The United States of America as represented by the Secretary of the Army, Washington, D.C.

[21] Appl. No.: 66,984

[22] Filed: Aug. 16, 1979

[51] Int. Cl.³ .................... H03K 3/17; H02M 3/335
[52] U.S. Cl. .................... 307/265; 307/228; 307/247 R; 363/26
[58] Field of Search .......... 307/228, 234, 265, 247 R; 363/26; 375/22; 318/599

[56] References Cited

U.S. PATENT DOCUMENTS

| | | | |
|---|---|---|---|
| 3,510,780 | 5/1970 | Buehrle | 375/22 |
| 3,559,030 | 1/1971 | Bussard | 363/26 |
| 3,870,962 | 3/1975 | D'Errico | 307/265 |
| 4,150,030 | 4/1979 | Nuechterlein | 363/26 |

*Primary Examiner*—Stanley D. Miller, Jr.
*Assistant Examiner*—B. P. Davis
*Attorney, Agent, or Firm*—Nathan Edelberg; Jeremiah G. Murray; Bernard Franz

[57] ABSTRACT

A ramp generator has a capacitor connected via a resistor to charge toward 12-volts on the clock lead. The other side of the capacitor is connected to a voltage divider between the control voltage input and ground, to give the initial value of the ramp, which determines the pulse width output. The ramp output is connected to the set input of a D type flip-flop, whose output is the desired pulse width. Another flip-flop is toggled by each clock pulse, to control the alternating selection of two output gates. Three diodes in series from the clock lead to the ramp conductor, across the capacitor, and then to ground are used to reset the ramp when each clock pulse goes to ground potential.

3 Claims, 3 Drawing Figures

CLOCK CONTROLLED PULSE WIDTH MODULATOR

The invention described herein may be manufactured and used by or for the Government for governmental purposes without the payment of any royalties thereon or therefor.

BACKGROUND OF THE INVENTION

This invention relates to clock controlled pulse width modulators and more particularly to such a circuit for use in feedback control of a D.C. to D.C. converter of the chopper type.

In many power supply applications it is necessary to boost a low voltage, unregulated buss to a higher, regulated voltage. Traditionally, this has been efficiently accomplished by use of some type of pulse width modulated regulation in conjunction with a D.C. to D.C. converter. Examples of the state of the art are shown in the following U.S. Pat. from class 363-26: Nos. 3,196,335; 3,341,765; 3,373,334; 3,735,235; 3,789,288; 3,903,468; 3,916,283; 3,925,715; 4,005,352; 4,017,787.

The known pulse width modulator circuits tend to be relatively complex.

SUMMARY OF THE INVENTION

An object of the invention is to provide a simple and effective pulse width modulator.

The circuit according to the invention includes a resistance-capacitance ramp generator, a first flip-flop toggled by each clock pulse, a second flip-flop set by the ramp voltage to determine the output pulse width, and gates coupling the flip-flop output to two output terminals alternately. The ramp generator is actuated by clock pulses and a pulse width control voltage, and reset by the clock pulses via a series of diodes each half cycle. In the exemplary embodiment the ramp generator consists of only a capacitor, three resistors, and three diodes.

DETAILED DESCRIPTION

Figure 1:
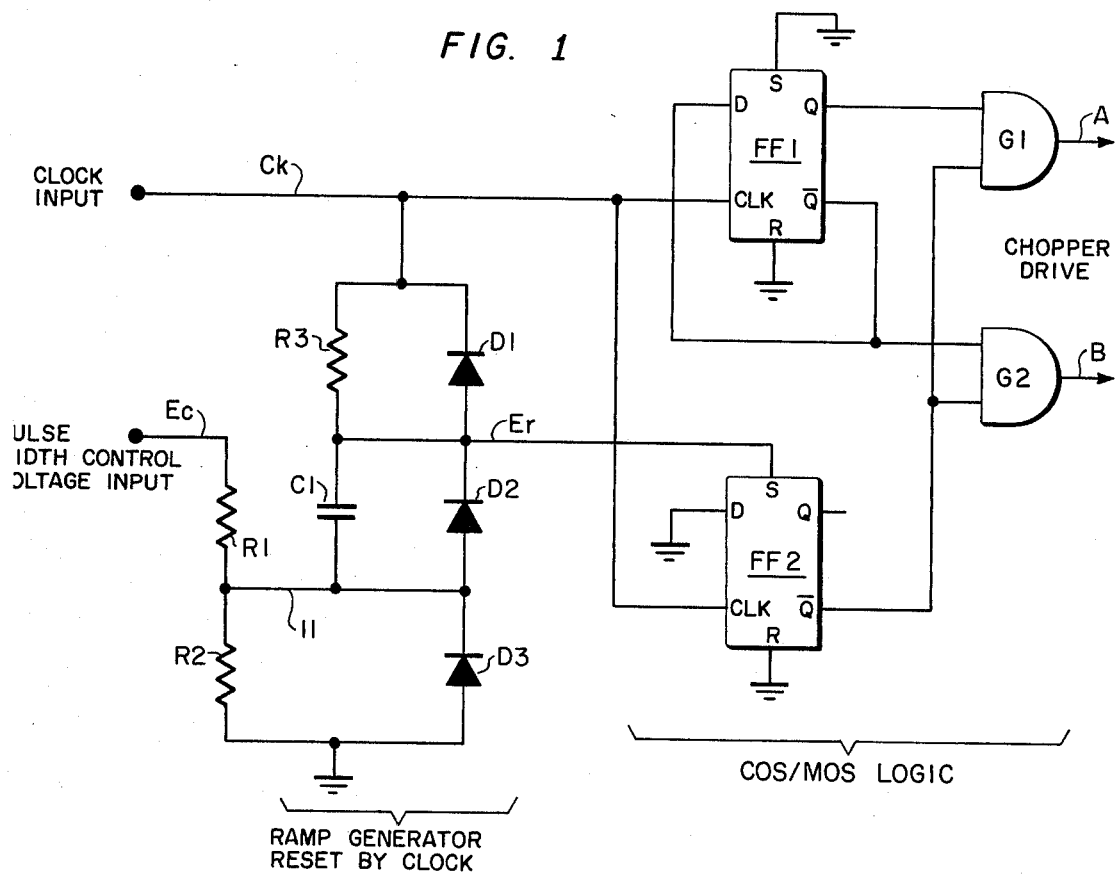
FIG. 1 is a schematic and functional block diagram of a pulse width modulator.

The circuit of the pulse width modulator is shown in FIG. 1. It comprises a ramp generator, two flip-flops FF1 and FF2, and two gates G1 and G2. It is controlled by a clock input on lead Ck, and a pulse width control input voltage on lead Ec. The output is on chopper drive leads A and B alternately.

The ramp generator comprises a capacitor C1 between leads Er and 11, a resistor divider R1, R2 between leads Ec and ground with the tap to lead 11, a resistor R3 between leads Ck and Er, and three diodes D1, D2, D3 in series shunting respectively resistor R3, capacitor C1, and resistor R2.

Preferably COS/MOS logic is used for the flip-flops and gates, the flip-flops being on a single type CD4013A chip, and the gates on half of a type CD4081B chip.

The control voltage on lead Ec determines the pulse width of the signals on leads A and B. The circuit performs as follows.

When the clock input to the circuit makes a positive transition, three things happen.

(1) Capacitor C1 starts to charge through R3. This produces an exponential ramp with a D.C. offset equal to Ec (the amplified error voltage).

Figure 2:
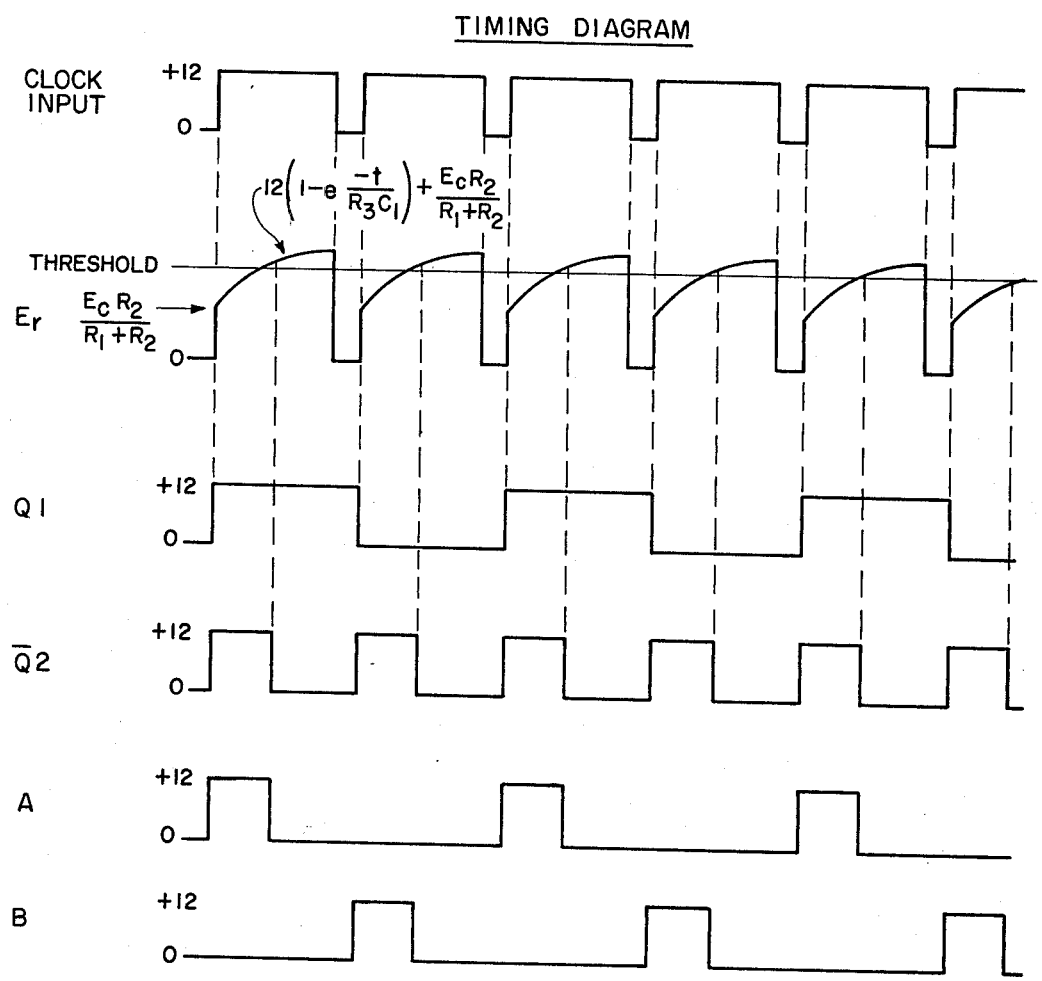
FIG. 2 comprises graphs showing operation of the circuit of FIG. 1.

(2) The $\overline{Q}$ output of FF2 is clocked positive, and (3) FF1 is toggled. After the clock's positive transition, either A or B will be positive depending on the state of $\overline{Q}$ and Q of FF1. The ramp increases in amplitude and at some point reaches the logic "1" threshold potential of the set input to FF2. At this time, $\overline{Q}$ of FF2 sets to zero and A or B (whichever was high) is gated off. When the clock makes its negative transition, D1, D2 and D3 are forward biased and the ramp voltage, Er, is reset to approximately +0.6 volts, which is a logic "0" at the set input of flip-flop FF2. During the next positive clock transition the same sequence of events occurs except that the pulse width modulated output shifts from A to B (or from B to A as the case may be). This is due to the toggling of FF1 on every positive clock transition. The timing diagram (FIG. 2) will help illustrate the sequence of events more clearly.

The pulse width of the outputs may be computed as follows: Since the output pulse goes high when the clock goes high and goes low when the ramp reaches the logic "1" threshold at the set terminal of FF2, the pulse width may be calculated as the time it takes the ramp to reach this threshold. This condition is met when, $$E_{CLK}(1 - e^{-t/R_3C_1}) + \frac{E_c R_2}{R_1 + R_2} = E_s$$

Solving for t, $$t = R_3C_1 \ln \frac{E_{CLK}}{E_c + E_{CLK} - E_s} \quad (1)$$

where
- $E_{CLK}$ = "high" voltage of clock
- $E_c$ = pulse width control voltage
- $C_c' = E_c R_2/R_1 + R_2$
- $E_s$ = threshold potential of set terminal on FF2.

CIRCUIT ADVANTAGES AND APPLICATIONS

Although the concept of pulse width modulation is not new, this circuit provides an extremely simple, versatile and efficient implementation of this concept.

Application in Pulse Width Modulated Power Supply

Figure 3:
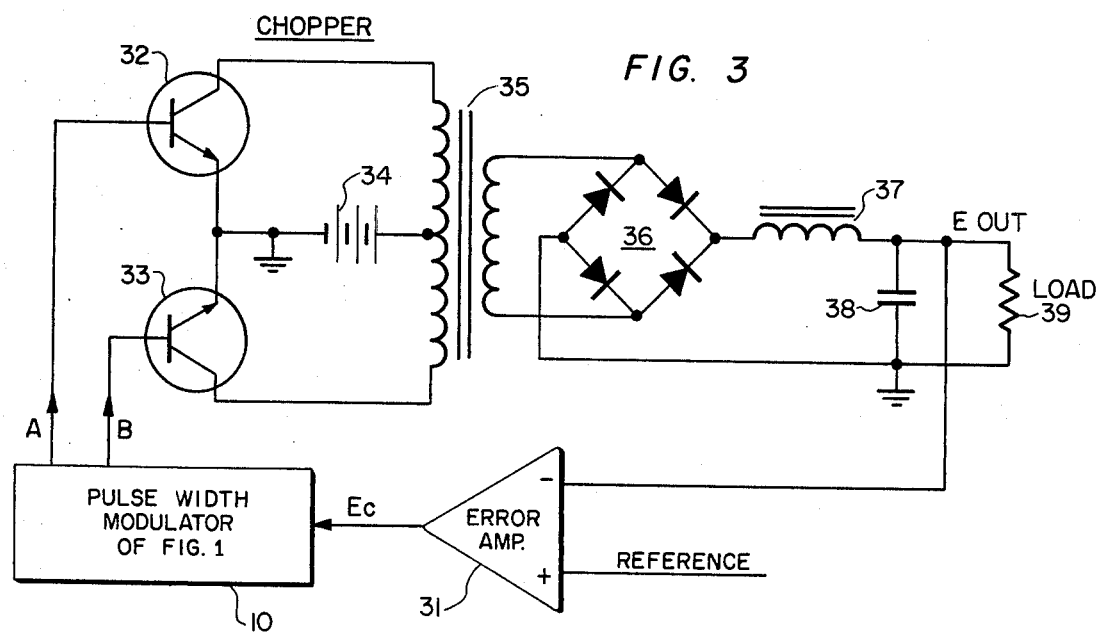
FIG. 3 is a schematic and block diagram showing the circuit incorporated in a D.C. to D.C. converter with feedback regulation.

The circuit was originally designed to be used in the control loop of a pulse width modulated power supply (see FIG. 3). In this application the pulse width modulator converts the amplified error voltage, $E_c$, into the appropriate duty cycle for the D.C. chopper. The pulse width modulator has many advantages in this application.

1. Because of utilization of COS/MOS logic, the modulator consumes very little power. This improves overall power supply efficiency.

2. The modulator is extremely simple and low cost.

3. The modulator has very fast response time. This is essential for loop stabilization.

4. Because the modulator is clock controlled, it may be synchronized with other modulators to form a multiphase power supply. In fact, it may be easily synchronized with any other circuit function desired.

5. The maximum duty cycle can be limited by the "low" state time of the clock by adding additional gates. This would prevent overlap of transistor conduction times in the chopper caused by stored base charge.

The D.C. to D.C. converter of FIG. 3 has a chopper comprising transistors 32 and 33 connected to a D.C. source such as a battery 34 and the primary winding of a transformer 35. The secondary circuit includes a rectifier 36 and an integrator or filter comprising a series inductor 37 followed by a shunt capacitor 38, to supply D.C. power to a load 39. Feedback control of the output voltage is accomplished with an error amplifier 31 and the pulse width modulator 10, which are connected by lead $E_c$.

Other Applications

The circuit is versatile enough to be used in almost any pulse width modulation application. It may be noted by examination of equation (1), that the output pulse width is not a linear function of $E_c$. In the closed loop power supply application it is not necessary to have a perfectly linear transfer function. $R_3$ and $C_1$ were chosen so that the ramp was approximately linear for the particular clock frequency. If a linear transformation is desired, however, a constant current source may be substituted in place of $R_3$. In some applications a selected non-linear transfer function may be desirable. This may easily be accomplished by substituting the appropriate non-linear element or network for $R_3$.

The polarity of the relationship between the control voltage ($E_c$) and the pulse width may be reversed by connecting the common inputs of G1 and G2 to Q2 instead of $\overline{Q2}$.

CONCLUSION

We know of no other pulse width modulation scheme that is as simple and effective. The entire circuit is constructed of two integrated circuits, three diodes, three resistors, and one capacitor.

What is claimed is:

1. A pulse width modulator comprising a ramp generator to produce a ramp voltage on a ramp conductor, first and second flip-flops, and first and second gates; controlled by clock pulses on a clock conductor and a control voltage on a control conductor, the clock pulses occurring in repetitive intervals of a fixed duration with a first voltage level for a relatively long duration in each interval and a second voltage level for the remainder thereof:

wherein said ramp generator comprises capacitor means, charging means, and diode means, connected to said clock conductor, control conductor and ramp conductor, so that immediately following each transition of the clock pulses to said first voltage level the ramp voltage on the ramp conductor starts at an initial voltage which is a given function of said control voltage and changes toward another value, the ramp voltage being reset by said diode means in response to said second voltage level on the clock lead to a voltage level very near to said second level;

each flip-flop having first and second states, the first flip-flop being connected to the clock conductor to change state in response to each transition of the clock pulses to the first voltage level; the second flip-flop being connected to the ramp conductor and clock conductor, so that it is set to the first state in response to the voltage on the ramp conductor reaching a predetermined level, and it is reset to the second level in response to the transition of the clock pulses to the first level;

the first and second flip-flops being connected to the first and second gates, to select the first gate with the first flip-flop in the first state and to select the second gate with the first flip-flop in the second state; and the selected gate has a pulse output at a given level during the interval that the second flip-flop is in the first state.

2. A pulse width modulator as set forth in claim 1, wherein said ramp generator includes a voltage divider comprising first and second resistors connected in series between said control conductor and a conductor at said reference voltage level with the voltage at the junction of the two resistors being said given function of said control voltage; said capacitor means is a capacitor connected between said ramp conductor and said junction; said charging means comprises a third resistor connected between the clock conductor and the ramp conductor; and said diode means comprises a first diode connected between the clock conductor and the ramp conductor, a second diode connected between the ramp conductor and said junction, and a third diode connected between said junction and a conductor at the reference voltage level.

3. A pulse width modulator, as set forth in claim 2, wherein said first and second flip-flops are D type flip-flops having set and reset inputs for D.C. input control, and D and clock inputs for clock input control; with the set input of the second flip-flop connected to the ramp conductor, with reference voltage connections to both reset inputs to the set input of the first flip-flop and to the D input of the second flip-flop, with the D input of the first flip-flop coupled to an output thereof, and with both clock inputs connected to the clock conductor.

* * * * *